US011558972B2

(12) United States Patent
Salayandia et al.

(10) Patent No.: US 11,558,972 B2
(45) Date of Patent: *Jan. 17, 2023

(54) ELECTRICAL CENTER COVER WITH MACHINE-READABLE INDICATOR CONFIRMATION OF LOCK ENGAGEMENT

(71) Applicant: APTIV TECHNOLOGIES LIMITED, St. Michael (BB)

(72) Inventors: Itzel Alejandra Hinojos Salayandia, Ciudad Juárez (MX); Eric J. Stern, Farmington Hills, MI (US); Sergio Armendariz Molina, Ciudad Juárez (MX); Daniel Scott Eichorn, Auburn Hills, MI (US); Daniel Alejandro Argumedo Sifuentes, Ciudad Juárez (MX); Roberto Carlos Chacon, Ciudad Juárez (MX)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 140 days.

This patent is subject to a terminal disclaimer.

(21) Appl. No.: 16/952,277

(22) Filed: Nov. 19, 2020

(65) Prior Publication Data

US 2022/0159858 A1    May 19, 2022

(51) Int. Cl.
*H05K 5/03*  (2006.01)
*B60R 16/02*  (2006.01)
*H05K 5/02*  (2006.01)
*B60R 16/023*  (2006.01)

(52) U.S. Cl.
CPC ............ *H05K 5/03* (2013.01); *B60R 16/0239* (2013.01); *H05K 5/0221* (2013.01); *H05K 5/0239* (2013.01)

(58) Field of Classification Search
None
See application file for complete search history.

(56) References Cited

U.S. PATENT DOCUMENTS

| 6,431,880 | B1 | 8/2002 | Davis et al. |
| 7,134,921 | B2 | 11/2006 | Siracki et al. |
| 7,700,875 | B2* | 4/2010 | Lalancette ............. H02G 3/086 174/53 |
| 7,727,022 | B2 | 6/2010 | Polehonki et al. |
| 7,845,959 | B2 | 12/2010 | Czyz et al. |
| 3,027,168 | A1 | 9/2011 | Senk et al. |
| 8,023,272 | B2* | 9/2011 | Shimizu ............... H05K 9/0067 361/752 |
| 9,648,766 | B1* | 5/2017 | Eom ................... B60R 16/0238 |

(Continued)

*Primary Examiner* — Xanthia C Cunningham
(74) *Attorney, Agent, or Firm* — RMCK Law Group, PLC

(57) ABSTRACT

A cover for an electrical center of a vehicle includes a cover member defining a first cover lock assurance (CLA) feature and configured to cover electrical components of the electrical center when the first CLA feature is fully engaged with a second CLA feature defined by a housing of the electrical center and a CLA system configured to assure the full engagement of the cover member to the housing of the electrical center, the CLA system including a third CLA feature configured to selectively engage/disengage with the first and second CLA features to engage the cover member to the housing of the electrical center and a machine-readable indicator configured to be fully visible and readable by a CLA device when the third CLA feature is fully engaged and seated within the first and second CLA features.

20 Claims, 6 Drawing Sheets

(56) References Cited

U.S. PATENT DOCUMENTS

| | | | |
|---|---|---|---|
| 10,561,031 B2* | 2/2020 | Uchida | H05K 5/03 |
| 10,587,061 B2* | 3/2020 | Matsuoka | H01R 12/55 |
| 10,917,977 B2* | 2/2021 | Miklosi | H05K 5/0221 |
| 11,199,028 B2* | 12/2021 | Rathore | E05B 65/0089 |
| 11,202,381 B2* | 12/2021 | Miyake | H05K 5/0013 |
| 2007/0051608 A1* | 3/2007 | Pedersen | H01H 13/56 |
| | | | 200/341 |
| 2012/0268864 A1* | 10/2012 | Borowicz | H05K 5/0239 |
| | | | 361/752 |
| 2015/0009640 A1 | 1/2015 | Stern et al. | |
| 2017/0335603 A1* | 11/2017 | Alaerts | E05B 63/185 |
| 2018/0163387 A1* | 6/2018 | Staton | A61B 5/207 |

* cited by examiner

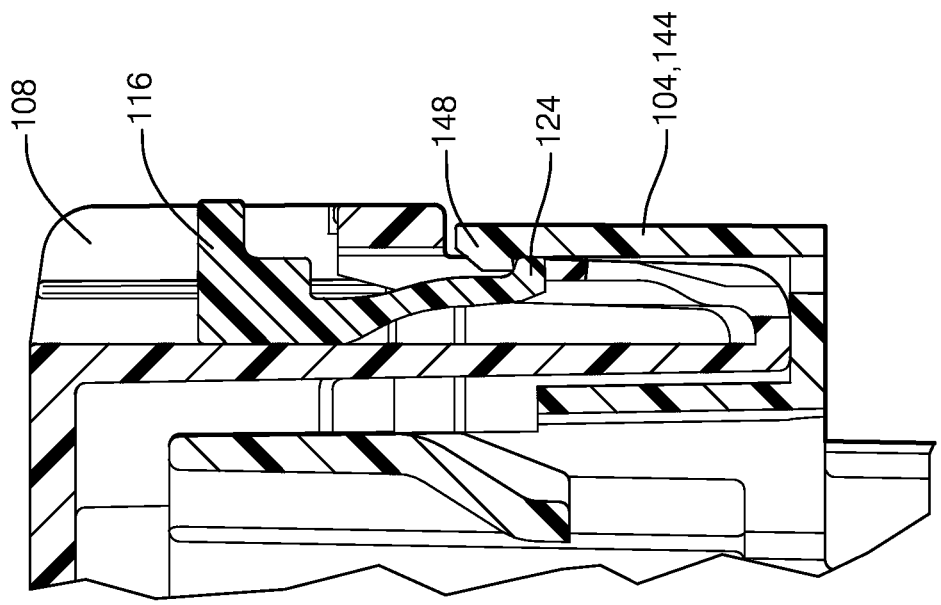
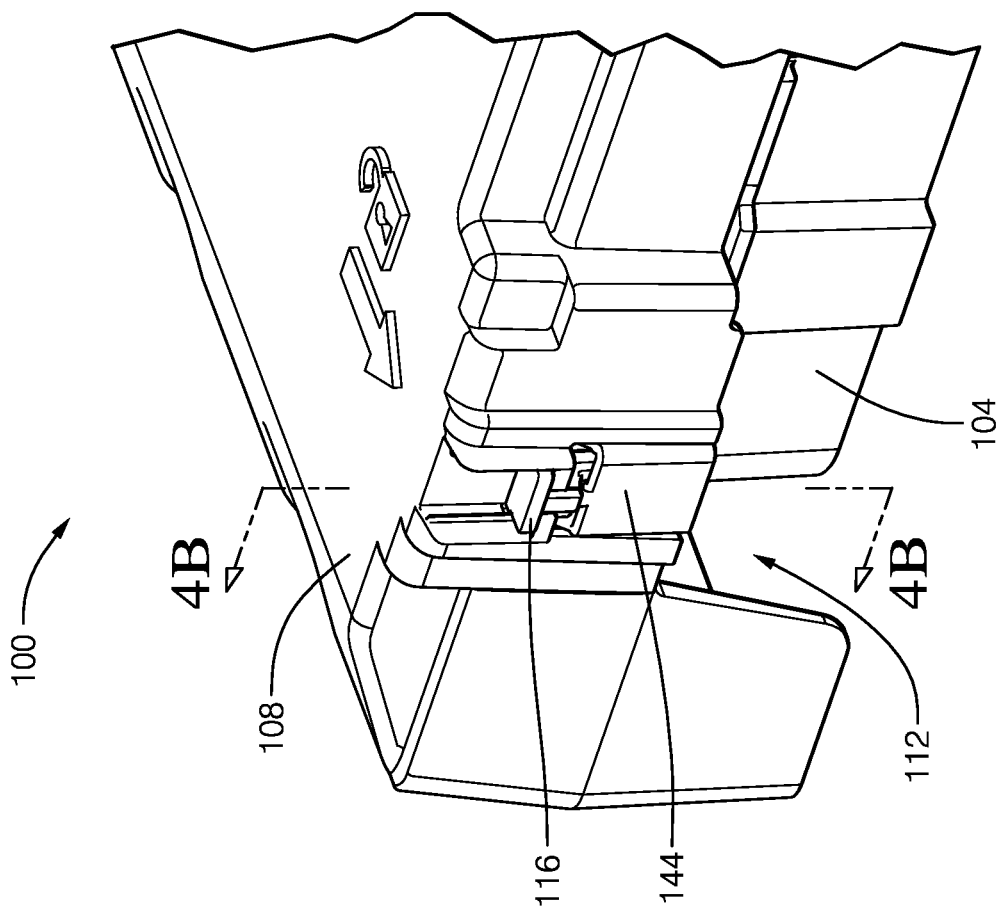

ELECTRICAL CENTER COVER WITH MACHINE-READABLE INDICATOR CONFIRMATION OF LOCK ENGAGEMENT

FIELD

The present disclosure generally relates to electrical center covers and, more particularly, to an electrical center cover with a machine-readable indicator for confirmation of lock engagement of the cover with the electrical center.

BACKGROUND

Electrical centers for vehicles, also commonly referred to as power distribution blocks (PDBs), handle power distribution to the vehicle's electrical system. A PDB typically comprises an array of electrical components (fuses, circuit breakers, relays, etc.) in a single unit. In order to protect the PDB and its electrical components from water and other environmental conditions, a cover is typically affixed to the PDB. Cover lock assurance (CLA) involves the assurance that the cover is fully engaged with the PDB. Conventional PDB covers include CLA mechanisms that involve human-dependent confirmation, such as listening for an audible click. Human-dependent CLA is unreliable, which can result in PDB covers being lost or not fully engaged, which could result in damage to the PDB's electrical components. This potential loss/damage increases costs. Thus, while conventional vehicle electrical center covers work for their intended purpose, there exists an opportunity for improvement in the relevant art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a cover for an electrical center of a vehicle is presented. In one exemplary implementation, the cover comprises a cover member defining a first cover lock assurance (CLA) feature and configured to cover electrical components of the electrical center when the first CLA feature is fully engaged with a second CLA feature defined by a housing of the electrical center, and a CLA system configured to assure the full engagement of the cover member to the housing of the electrical center, the CLA system comprising a third CLA feature configured to selectively engage/disengage with the first and second CLA features to engage the cover member to the housing of the electrical center and a machine-readable indicator configured to be fully visible and readable by a CLA device when the third CLA feature is fully engaged and seated within the first and second CLA features.

In some implementations, the machine-readable indicator is configured to be not fully visible and readable by the CLA device when the third CLA feature is partially engaged with the second CLA feature. In some implementations, the machine-readable indicator is a two-dimensional data matrix. In some implementations, the two-dimensional data matrix is a quick response (QR) code.

In some implementations, the first and second CLA features are engageable notch features, and wherein the third CLA feature is a clip feature that slidably engages through the first CLA feature and with the second CLA feature. In some implementations, the electrical center is a power distribution block (PDB) of the vehicle. In some implementations, the cover prevents water from entering the PDB and damaging the electrical components therein.

According to another aspect of the present disclosure, a method of covering an electrical center of a vehicle is presented. In one exemplary implementation, the method comprises providing a cover member defining a first cover lock assurance (CLA) feature and configured to cover electrical components of the electrical center when the first CLA feature is fully engaged with a second CLA feature defined by a housing of the electrical center, and providing a CLA system configured to assure the full engagement of the cover member to the housing of the electrical center, the CLA system comprising a third CLA feature configured to selectively engage/disengage with the first and second CLA features to engage the cover member to the housing of the electrical center, and a machine-readable indicator configured to be fully visible and readable by a CLA device when the third CLA feature is fully engaged and seated within the first and second CLA features.

In some implementations, the method further comprises partially engaging the third CLA feature with the second CLA feature, wherein the machine-readable indicator is configured to be not fully visible and readable by the CLA device when the third CLA feature is partially engaged with the second CLA feature. In some implementations, the method further comprises fully engaging and seating the third CLA feature within the first and second CLA features, and reading, by the CLA device, the machine-readable indicator to assure the full engagement of the cover member to the housing of the electrical center.

In some implementations, the machine-readable indicator is a two-dimensional data matrix. In some implementations, the two-dimensional data matrix is a quick response (QR) code. In some implementations, the first and second CLA features are engageable notch features, and wherein the third CLA feature is a clip feature that slidably engages through the first CLA feature and with the second CLA feature. In some implementations, the electrical center is a power distribution block (PDB) of the vehicle. In some implementations, the cover prevents water from entering the PDB and damaging the electrical components therein.

According to yet another aspect of the present disclosure, a method of assembling a portion of an electrical system of a vehicle is presented. In one exemplary implementation, the method comprises providing an electrical center of the electrical system, wherein the electrical center defines a housing and comprises electrical components housed by the housing, and wherein the housing defines a first cover lock assurance (CLA) feature, providing a cover configured to cover the electrical components of the electrical center when engaged to the housing of the electrical center, wherein the cover comprises a cover member that defines a second CLA feature and a CLA system configured to assure the full engagement of the cover member to the housing of the electrical center, at least partially engaging a third CLA feature of the CLA system with the second and first CLA features to engage the cover member to the housing of the electrical center, and attempting reading, by a CLA device, a machine-readable indicator of the CLA system, wherein the machine-readable indicator configured to be fully visible and readable by the CLA device when the third CLA feature is fully engaged and seated within the second and first CLA features.

In some implementations, the method further comprises only partially engaging the third CLA feature with the second and first CLA features such that the machine-readable indicator is not fully visible, and failing to read, by the CLA device, the machine-readable indicator thereby failing to assure the full engagement of the cover member to the housing of the electrical center. In some implementations, the method further comprises fully engaging and seating the third CLA feature within the second and first CLA features, and successfully reading, by the CLA device, the machine-readable indicator thereby assuring the full engagement of the cover member to the housing of the electrical center. In some implementations, the machine-readable indicator is a two-dimensional data matrix. In some implementations, the two-dimensional data matrix is a quick response (QR) code.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4A-4B illustrate zoomed-in perspective views and cross-sectional views of the cover and the housing of the electrical center and first, second, and third CLA features according to some implementations of the present disclosure;

DETAILED DESCRIPTION

Figure 1B:
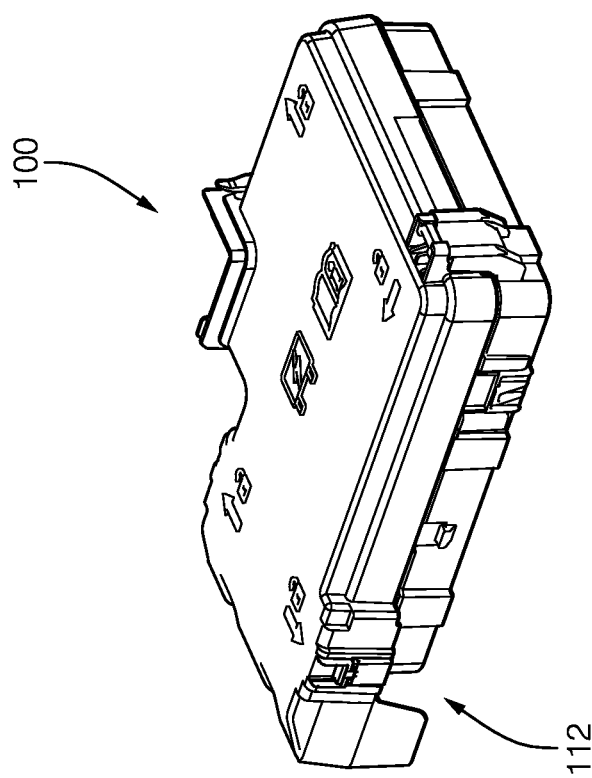
FIGS. 1A-1B illustrate exploded and perspective views of a cover for an electrical center of a vehicle including first and second respective CLA features according to some implementations of the present disclosure.
Figure 1A:
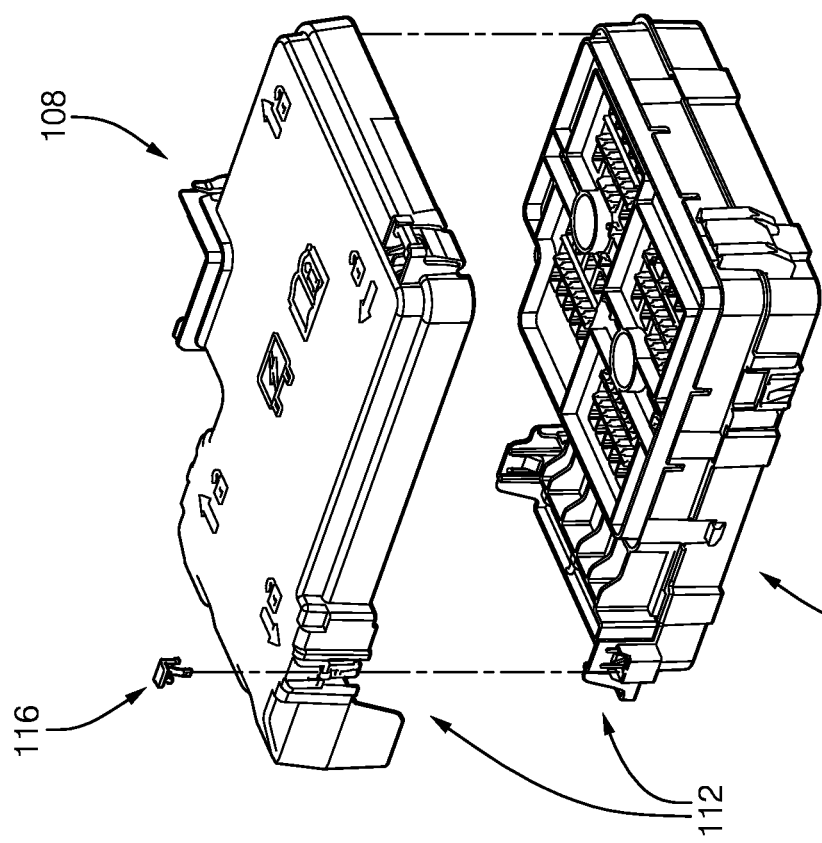

As previously discussed, conventional electrical center (e.g., power distribution block, or PDB) covers include cover lock assurance CLA mechanisms that involve human-dependent confirmation, such as listening for an audible click. Human-dependent CLA is unreliable, which can result in PDB covers being lost or not fully engaged, which could result in damage to the PDB's electrical components. This potential loss/damage increases costs. Thus, while conventional vehicle electrical center covers work for their intended purpose, there exists an opportunity for improvement in the relevant art. Referring now to FIGS. 1A-1B, exploded and perspective views of a cover 100 for an electrical center 104 of a larger electrical system (not shown) of a vehicle (not shown) according to some implementations of the present disclosure are illustrated. For purposes of this disclosure, the electrical center 104 is a PDB comprising electrical components such as fuses, circuit breakers, relays, and the like in a single unit. It will be appreciated, however, that the systems and methods of the present disclosure are applicable to any suitable electrical centers requiring covering.

Figure 2A:
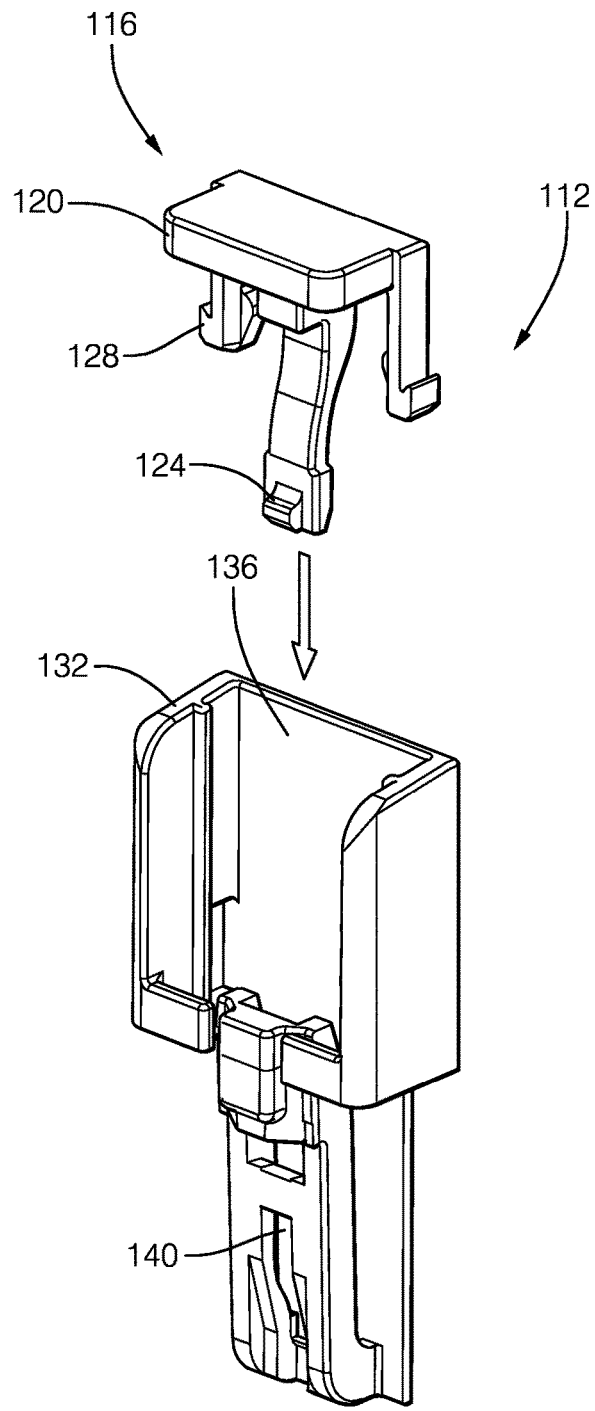
FIGS. 2A-2B illustrate exploded and perspective views of a cover lock assurance (CLA) system of the cover including a third CLA feature and a machine-readable indicator according to some implementations of the present disclosure.
Figure 2B:
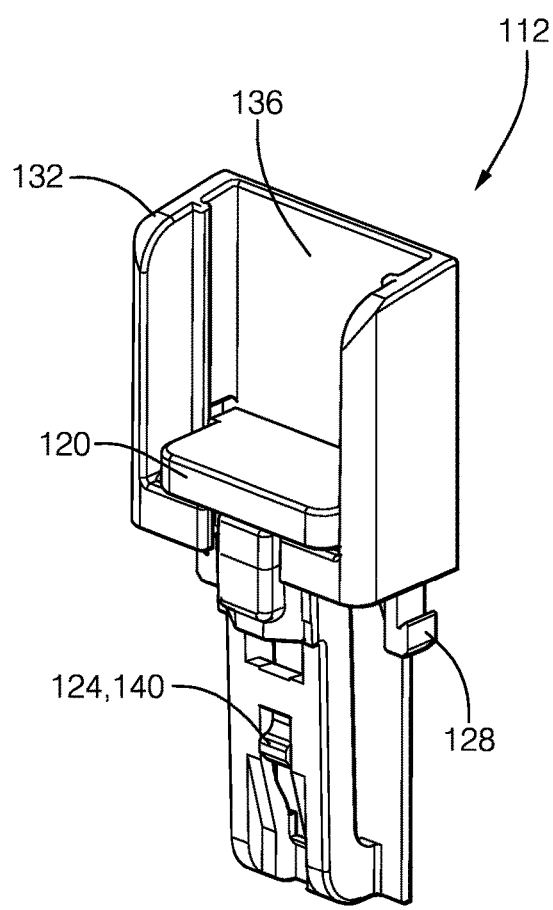

The cover 100 generally comprises a cover member 108 and a CLA system 112. The cover member 108 is configured to cover the electrical components of the electrical center 104 (generally illustrated) when the CLA system 112 is fully engaged, including engagement of first and second CLA features defined by the cover member 108 and the electrical center 104 (shown in other FIGS. and described below). The cover 100, for example, could protect or insulate the electrical components of the electrical center 104 from water/moisture, which could potentially cause damage. The CLA system 112 also comprises a third CLA feature 116. Referring now to FIGS. 2A-2B and with continued reference to the previous FIGS., exploded and perspective views of an example configuration of the CLA system 112 according to some implementations of the present disclosure are illustrated. As shown, the third CLA feature 116 is a clip feature that defines a top/base member 120, a bottom/clip member 124, and opposing outer clip members 128.

The cover member 108 defines the first CLA feature 132 in addition to a machine-readable indicator 136 defined by the cover member 108 that is also part of the CLA system 112. The electrical center 104 (e.g., its housing) defines the second CLA feature 140, which is engageable by the first CLA feature 132 as well as the third CLA feature 116 (via bottom/clip member 124). As shown, these first and second CLA features 132, 140 are engageable notches that slidably engage each other but do not provide locking functionality. Referring now to FIGS. 3A-3B and 4A-4B and with continued reference to the previous FIGS., front views of partially engaged and fully engaged configurations of the CLA system 112 including the machine-readable indicator 136 and zoomed-in perspective views and cross-sectional views of the cover 100 and the electrical center 104 according to some implementations of the present disclosure are illustrated.

Figure 3A:
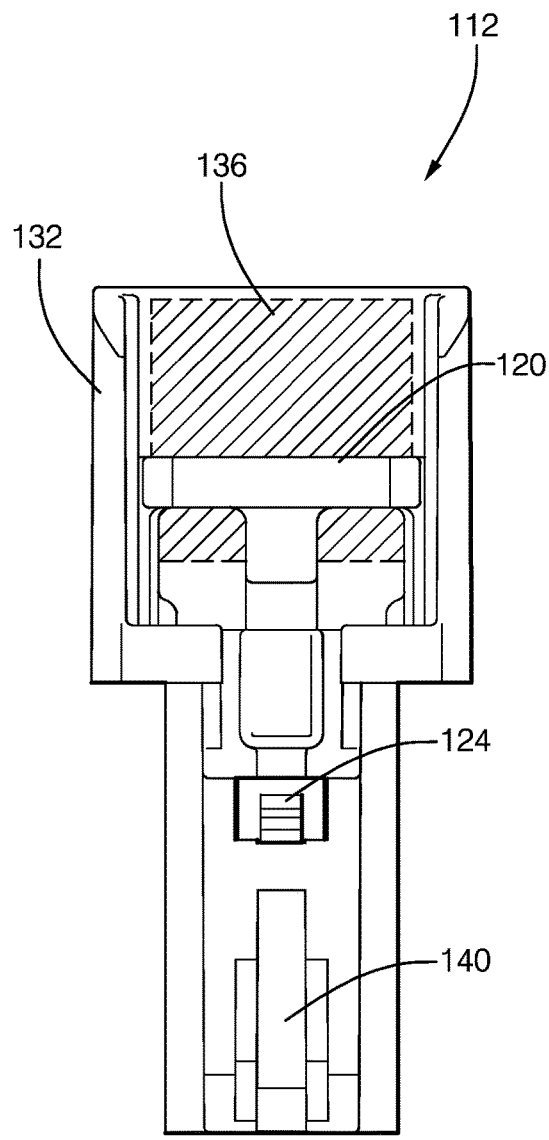
FIGS. 3A-3B illustrate front views of partially engaged and fully engaged configurations the CLA system according to some implementations of the present disclosure.
Figure 3B:
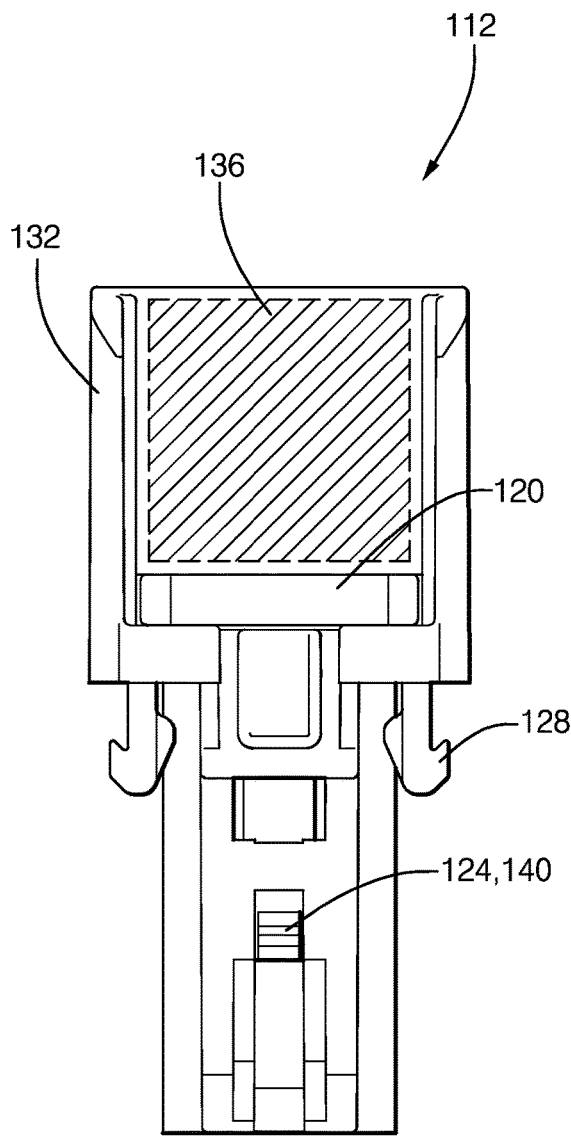

As shown, the machine-readable indicator 136 is configured to be fully visible and readable by a CLA device (not shown) when the third CLA feature 116 is fully engaged and seated within the first and second CLA features 132, 140. In FIGS. 4A-4B, the second CLA feature 140 (defined in a housing 144 of the electrical center 104) and a clip member 148 of the second CLA feature 140 are illustrated in greater detail. In one exemplary implementation, the machine-readable indicator is a two-dimensional data matrix or barcode, such as a quick response (QR) code or the like. It will be appreciated that other suitable machine-readable indicators could be utilized, provided that they are only partially visible when the third CLA feature 116 is only partially engaged, as shown in FIG. 3A. While the CLA device is not explicitly shown, it will be appreciated that one skilled in the art recognizes that the CLA device could be any handheld or robotically-controlled scanning or reading device for machine-readable indicators (a camera, an infrared scanner, etc.). By requiring full engagement and seating of the third CLA feature 116 in order to then read the machine-readable indicator 136, full engagement of the cover 100 to the electrical center 104 can be assured.

Figure 5C:
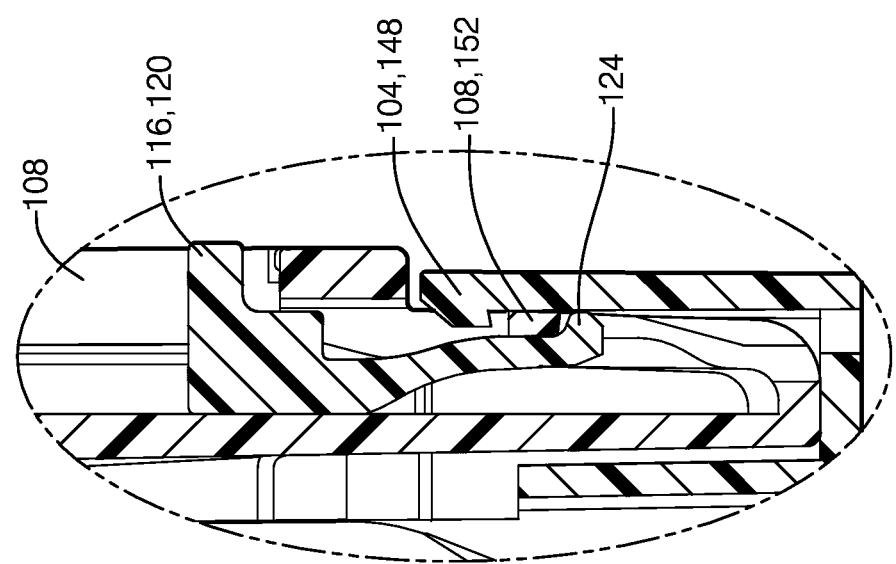
FIGS. 5A-5C illustrate cross-sectional views of the first, second, and third CLA features at various stages of engagement according to some implementations of the present disclosure.
Figure 5B:
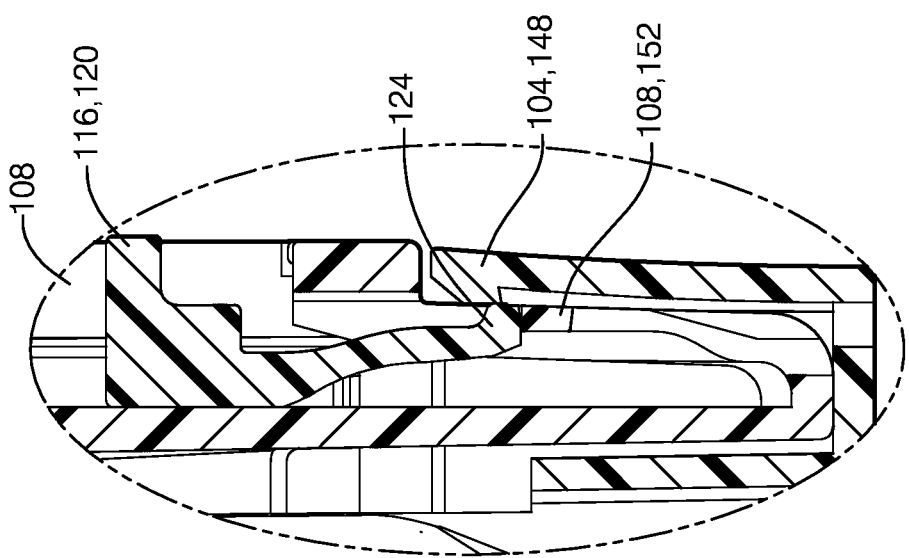
Figure 5A:
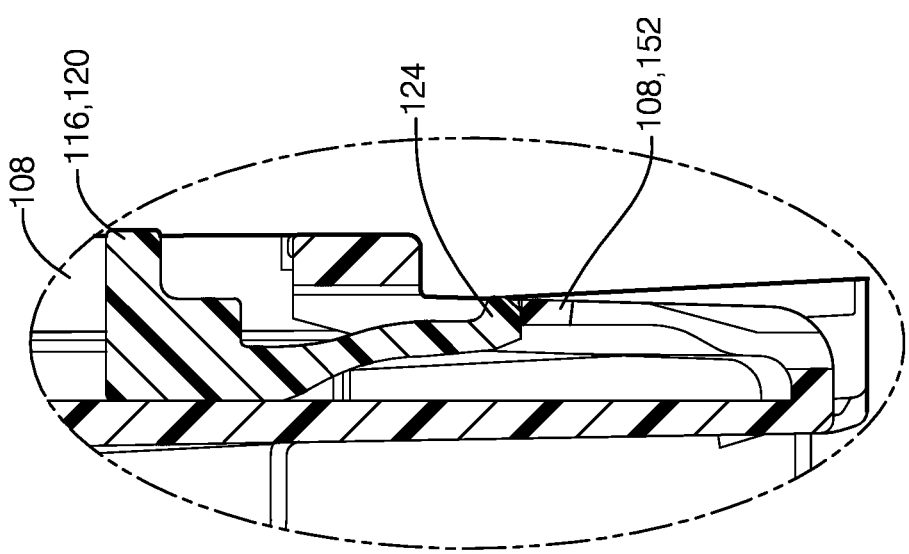

Referring now to FIGS. 5A-5C, cross-sectional views of the first, second, and third CLA features 132, 140, and 116 at various stages of engagement according to some implementations of the present disclosure are illustrated in greater detail. In FIG. 5A, the third CLA feature 116 is partially engaged up to a point where the bottom/clip member 124 contacts a surface 152 of the cover member 108. Beyond this point, the third CLA feature 116 is engaged with the first CLA feature 132 but still removable from the cover member 108 (i.e., the second CLA feature 132). In FIG. 5B, the third CLA feature 116 is partially engaged such that the bottom/clip member 124 of the third CLA feature 116 engages with the clip member 148 of the second CLA feature 140. This represents engagement of the third CLA feature 116 with both the first and second CLA features 132, 140, but not full engagement. Finally, in FIG. 5C, the third CLA feature 116 is fully engaged and seated with the clip member 148 of the second CLA feature 140 (the electrical center 104) being engaged with the surface 152 of the second CLA feature 132 (the cover member 108).

Figure 6:
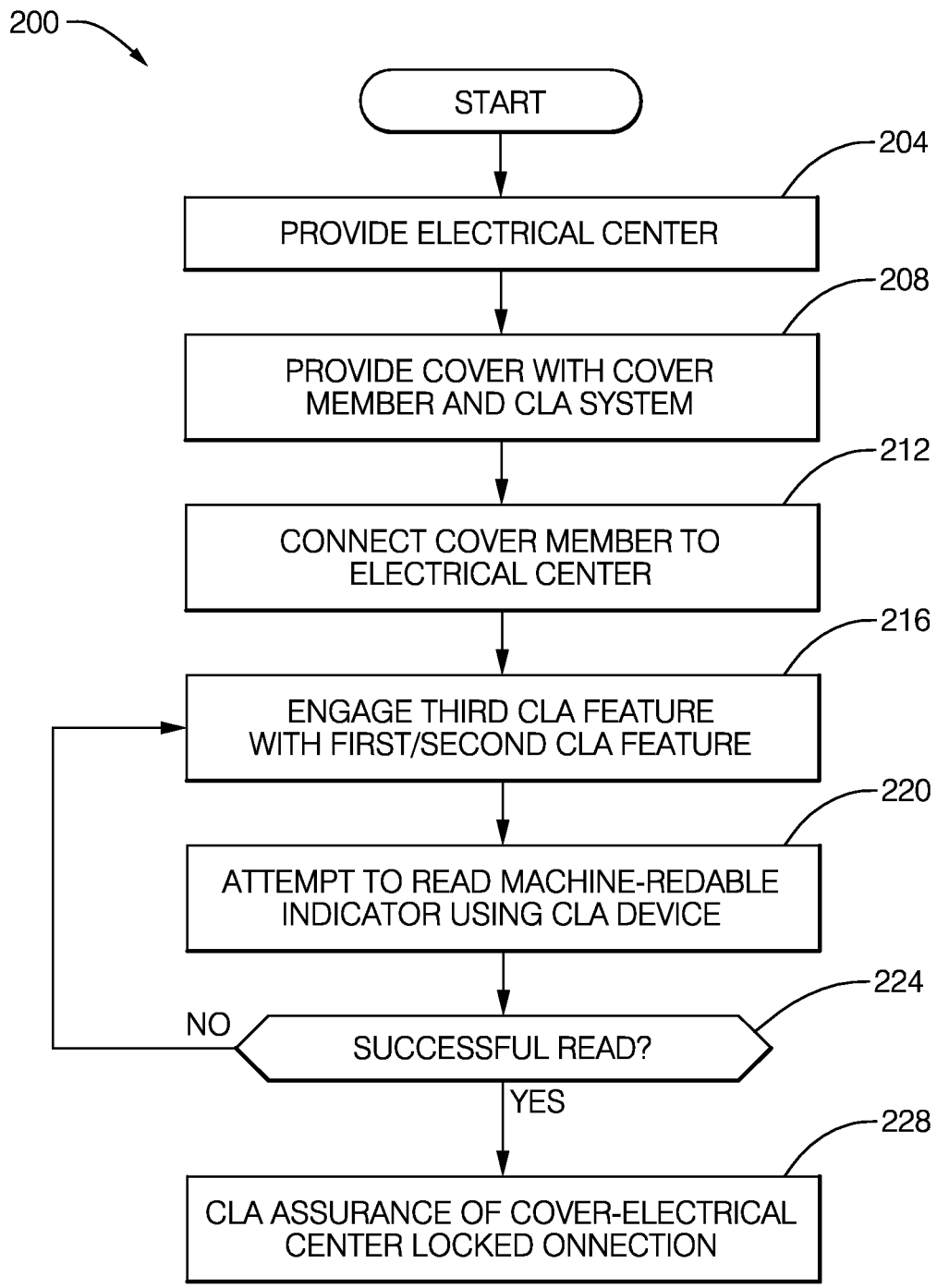
FIG. 6 illustrates a flow diagram of an example method of assembling a portion of an electrical system of a vehicle and, more particularly, covering an electrical center of the vehicle, according to some implementations of the present disclosure.

Referring now to FIG. 6, a flow diagram of an example method 200 of assembling a portion of an electrical system of a vehicle and, more particularly, covering an electrical center of the vehicle, according to some implementations of the present disclosure, is illustrated. While the components of FIGS. 1-5C are generally referenced, it will be appreciated that the method 200 could be applicable to the assembly of any suitable electrical centers/systems. At 204, the electrical center 104 is provided. At 208, the cover 100 comprising the cover member 108 and the CLA system 112 is provided. At 212, the cover member 108 is connected to or engaged with the electrical center 104. At 216, the third CLA feature 116 is engaged with the first and second CLA features 132, 140. At 220, an attempt is made by the CLA device to read the machine-readable indicator 136. This could also be described as a scanning operation or read attempt. At 224, a determination is made (e.g., by the CLA device or a robotic installer) whether the machine-readable indicator 136 was successfully read. For example, when the third CLA feature 116 is only partially engaged and not fully seated, the machine-readable indicator 136 is not fully visible and therefore not machine-readable. When successful, assurance of the cover-electrical center locked connection is made at 228 and the method 200 ends or returns to 204 for another cycle. Otherwise, the method 200 returns to 216 where engagement of the third CLA feature 116 continues and another attempt is made to assure the cover-electrical center locked connection.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

As used herein, the term module may refer to, be part of, or include: an Application Specific Integrated Circuit (ASIC); an electronic circuit; a combinational logic circuit; a field programmable gate array (FPGA); a processor or a distributed network of processors (shared, dedicated, or grouped) and storage in networked clusters or datacenters that executes code or a process; other suitable components that provide the described functionality; or a combination of some or all of the above, such as in a system-on-chip. The term module may also include memory (shared, dedicated, or grouped) that stores code executed by the one or more processors.

The term code, as used above, may include software, firmware, byte-code and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A cover for an electrical center of a vehicle, the cover comprising:
    a cover member defining a first cover lock assurance (CLA) feature and configured to cover electrical components of the electrical center when the first CLA feature is fully engaged with a second CLA feature defined by a housing of the electrical center; and
    a CLA system configured to assure the full engagement of the cover member to the housing of the electrical center, the CLA system comprising:
        a third CLA feature configured to selectively engage/disengage with the first and second CLA features to engage the cover member to the housing of the electrical center; and
        a machine-readable indicator configured to be fully visible and readable by a CLA device when the third CLA feature is fully engaged and seated within the first and second CLA features.

2. The cover of claim 1, wherein the machine-readable indicator is configured to be not fully visible and readable by the CLA device when the third CLA feature is partially engaged with the second CLA feature.

3. The cover of claim 2, wherein the machine-readable indicator is a two-dimensional data matrix.

4. The cover of claim 3, wherein the two-dimensional data matrix is a quick response (QR) code.

5. The cover of claim 1, wherein the first and second CLA features are engageable notch features, and wherein the third CLA feature is a clip feature that slidably engages through the first CLA feature and with the second CLA feature.

6. The cover of claim 1, wherein the electrical center is a power distribution block (PDB) of the vehicle.

7. The cover of claim 6, wherein the cover prevents water from entering the PDB and damaging the electrical components therein.

8. A method of covering an electrical center of a vehicle, the method comprising:
    providing a cover member defining a first cover lock assurance (CLA) feature and configured to cover electrical components of the electrical center when the first CLA feature is fully engaged with a second CLA feature defined by a housing of the electrical center; and
    providing a CLA system configured to assure the full engagement of the cover member to the housing of the electrical center, the CLA system comprising:
        a third CLA feature configured to selectively engage/disengage with the first and second CLA features to engage the cover member to the housing of the electrical center; and
        a machine-readable indicator configured to be fully visible and readable by a CLA device when the third CLA feature is fully engaged and seated within the first and second CLA features.

9. The method of claim 8, further comprising partially engaging the third CLA feature with the second CLA feature, wherein the machine-readable indicator is configured to be not fully visible and readable by the CLA device when the third CLA feature is partially engaged with the second CLA feature.

10. The method of claim 8, further comprising:
    fully engaging and seating the third CLA feature within the first and second CLA features; and
    reading, by the CLA device, the machine-readable indicator to assure the full engagement of the cover member to the housing of the electrical center.

11. The method of claim 10, wherein the machine-readable indicator is a two-dimensional data matrix.

12. The method of claim 11, wherein the two-dimensional data matrix is a quick response (QR) code.

13. The method of claim 8, wherein the first and second CLA features are engageable notch features, and wherein the third CLA feature is a clip feature that slidably engages through the first CLA feature and with the second CLA feature.

14. The method of claim 8, wherein the electrical center is a power distribution block (PDB) of the vehicle.

15. The method of claim 14, wherein the cover prevents water from entering the PDB and damaging the electrical components therein.

16. A method of assembling a portion of an electrical system of a vehicle, the method comprising:
    providing an electrical center of the electrical system, wherein the electrical center defines a housing and comprises electrical components housed by the housing, and wherein the housing defines a first cover lock assurance (CLA) feature;

providing a cover configured to cover the electrical components of the electrical center when engaged to the housing of the electrical center, wherein the cover comprises a cover member that defines a second CLA feature and a CLA system configured to assure the full engagement of the cover member to the housing of the electrical center;

at least partially engaging a third CLA feature of the CLA system with the second and first CLA features to engage the cover member to the housing of the electrical center; and attempting reading, by a CLA device, a machine-readable indicator of the CLA system, wherein the machine-readable indicator configured to be fully visible and readable by the CLA device when the third CLA feature is fully engaged and seated within the second and first CLA features.

17. The method of claim 16, further comprising:
only partially engaging the third CLA feature with the second and first CLA features such that the machine-readable indicator is not fully visible; and
failing to read, by the CLA device, the machine-readable indicator thereby failing to assure the full engagement of the cover member to the housing of the electrical center.

18. The method of claim 16, further comprising:
fully engaging and seating the third CLA feature within the second and first CLA features; and
successfully reading, by the CLA device, the machine-readable indicator thereby assuring the full engagement of the cover member to the housing of the electrical center.

19. The method of claim 18, wherein the machine-readable indicator is a two-dimensional data matrix.

20. The method of claim 19, wherein the two-dimensional data matrix is a quick response (QR) code.

\* \* \* \* \*